(12) United States Patent
Chidambarrao et al.

(10) Patent No.: US 7,221,024 B1
(45) Date of Patent: May 22, 2007

(54) TRANSISTOR HAVING DIELECTRIC STRESSOR ELEMENTS FOR APPLYING IN-PLANE SHEAR STRESS

(75) Inventors: Dureseti Chidambarrao, Weston, CT (US); Brian J. Green, Yorktown Heights, NY (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 11/163,686

(22) Filed: Oct. 27, 2005

(51) Int. Cl.
*H01L 27/01* (2006.01)
(52) U.S. Cl. .................. 257/347; 257/414; 438/149; 438/412
(58) Field of Classification Search ........... 257/414, 257/347, 350, 417, 418, 254, E31.013; 438/149, 438/412, 479
See application file for complete search history.

(56) References Cited

U.S. PATENT DOCUMENTS

| | | |
|---|---|---|
| 6,717,216 B1 | 4/2004 | Doris et al. |
| 6,884,667 B1 | 4/2005 | Doris et al. |
| 2004/0113174 A1 | 6/2004 | Chidambarrao et al. |
| 2004/0217448 A1* | 11/2004 | Kumagai et al. .......... 257/627 |
| 2005/0067294 A1 | 3/2005 | Choe et al. |
| 2005/0263825 A1* | 12/2005 | Frohberg et al. ............ 257/369 |
| 2006/0202280 A1* | 9/2006 | Shima et al. ............... 257/371 |

OTHER PUBLICATIONS

W. Theiss, "Optical Properties of Porous Silicon", I. Physikalisches Institut, Aachen University of Technology (RWTH), D-52056 Aachen, Germany, Surface Science Reports, vol. 29, 1997, pp. 91-192.

* cited by examiner

*Primary Examiner*—Sara Crane
(74) *Attorney, Agent, or Firm*—Daryl K. Neff; H. Daniel Schnurmann

(57) ABSTRACT

A chip is provided which includes an active semiconductor region and a field effect transistor ("FET") having a channel region, a source region and a drain region all disposed within the active semiconductor region. The FET has a longitudinal direction in a direction of a length of the channel region, and a transverse direction in a direction of a width of the channel region. A first dielectric stressor element having a horizontally extending upper surface extends below a portion of the active semiconductor region, such as a northwest portion of the active semiconductor region. A second dielectric stressor element having a horizontally extending upper surface extends below a second portion of the active semiconductor region, such as a southeast portion of the active semiconductor region. Each of the first and second dielectric stressor elements shares an edge with the active semiconductor region, the edges extending in directions away from the upper surface.

20 Claims, 10 Drawing Sheets

TRANSISTOR HAVING DIELECTRIC STRESSOR ELEMENTS FOR APPLYING IN-PLANE SHEAR STRESS

BACKGROUND OF THE INVENTION

The present invention relates to semiconductor devices and processing. More particularly, the invention relates to semiconductor devices with dielectric stressor elements and methods of making the same.

A compressive stress or tensile stress can be applied to some types of transistors to increase their performance. In particular, the performance of a p-type field effect transistor ("PFET") improves when a longitudinal (in the direction of current flow) compressive stress is applied to the channel region. On the other hand, the performance of an n-type field effect transistor ("NFET") improves when a longitudinal tensile stress is applied to the channel region.

Various structures have been proposed for imparting a beneficial stress to the channel region of a transistor. In some cases, it has been proposed to provide one or more dielectric stressor elements in proximity with an NFET or PFET for applying a beneficial stress. For example, commonly assigned U.S. Patent Publication No. 2004/0113174 describes a way of embedding dielectric stressor elements in isolation regions at exterior edges of an active semiconductor region which houses an NFET or a PFET. In such case, the dielectric stressor element and the isolation region are merged and the processing used to form both the stressor element and the isolation region is merged. While enabling efficiencies, these isolation-stressor elements require that a design point be reached in which potentially conflicting requirements for the stress-applying function, the isolation function and the processing needed to fabricate them are all simultaneously satisfied.

Thus, according to the known art, dielectric stressor elements used for applying stresses to an NFET or PFET are constrained to the locations at which isolation regions are placed. To overcome this constraint, it is clear that further improved structures and processing are awaited.

SUMMARY OF THE INVENTION

According to an aspect of the invention, a chip is provided which includes an active semiconductor region having a west edge, an east edge, a north edge and a south edge, the active semiconductor region having a longitudinal direction in a direction between the west and east edges and a transverse direction in a direction between the north and south edges. A field effect transistor ("FET") has a channel region, a source region and a drain region all disposed within the active semiconductor region. A length of the channel region is disposed in the longitudinal direction, and a width of the channel region is disposed in the transverse direction.

A first dielectric stressor element underlies only a northwest portion of the active semiconductor region between the north and west edges, the first dielectric stressor element having a horizontally extending upper surface, the first dielectric stressor element sharing an edge with the active semiconductor region, the edge extending in a direction away from the upper surface. A second dielectric stressor element underlies only a southeast portion of the active semiconductor region between the south and east edges, the second dielectric stressor element having a horizontally extending upper surface and sharing an edge with the active semiconductor region, the edge extending in a direction away from the upper surface.

The first dielectric stressor element applies a stress to the channel region in a first direction and the second dielectric stressor element applies a stress to the channel region in a second direction opposite to the first direction. The two dielectric stressor elements combine together to apply a magnified shear stress to the channel region.

DETAILED DESCRIPTION

New ways of applying a compressive stress and/or a tensile stress to the channel region of a PFET or an NFET transistor are provided according to the embodiments of the present invention that offer simple processing and which are integratable into present methods of manufacturing PFET and NFET transistors of integrated circuits or "chips". According to the various embodiments of the invention described herein, FETs are provided in various forms in which at least two buried dielectric stressor elements underlying different portions of the active semiconductor region in exert stresses upon the channel region in different directions such that shear stress is applied to the channel region of the FET.

Figure 1A:
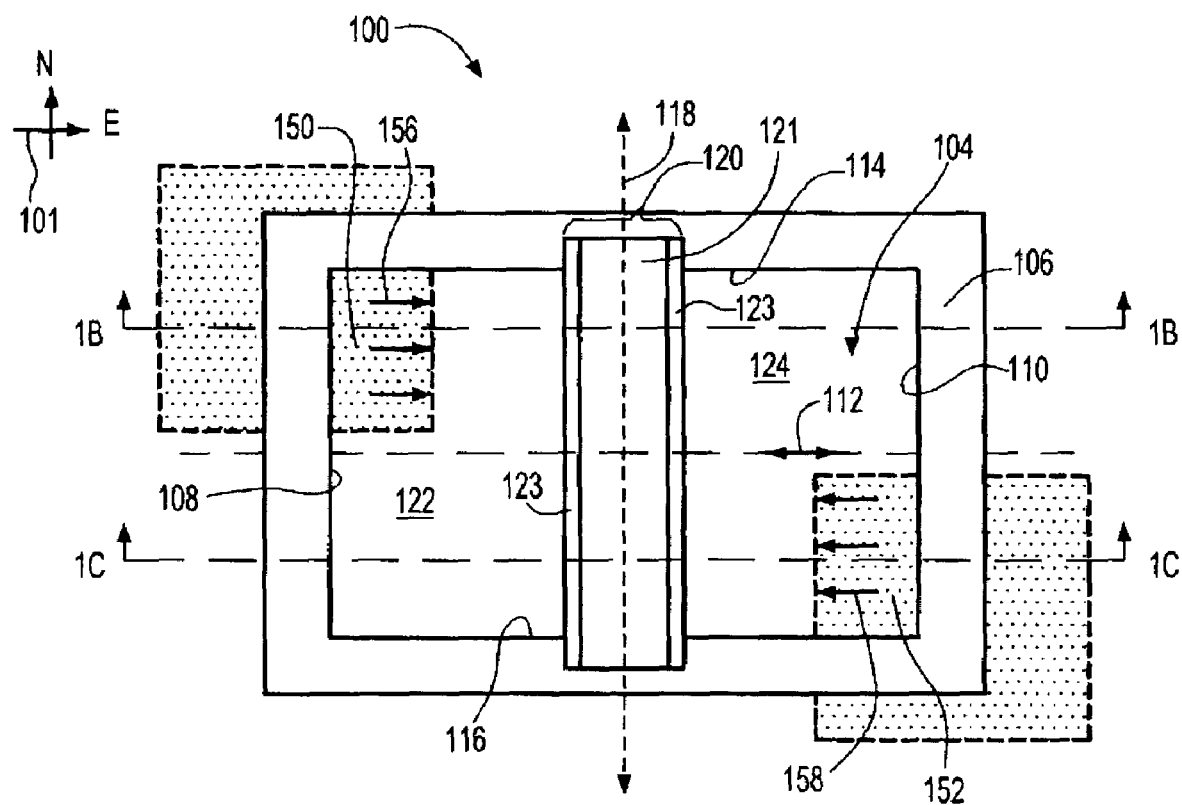
FIG. 1A is a face-up plan view of a PFET in accordance with an embodiment of the invention.

FIG. 1A is a face-up plan view illustrating an PFET 100 and buried dielectric stressor regions 150 and 152 that are used to apply a compressive stress to a channel region (not visible in FIG. 1A) of the PFET. As illustrated in FIG. 1A, the PFET 100 includes an active semiconductor region 104 which is bounded by an isolation region, illustratively being a trench isolation region, e.g., a shallow trench isolation ("STI") region 106. The STI region 106 thus defines the boundaries or "edges" of the active semiconductor region 104.

In describing PFET 100, it is helpful to provide a frame of reference in relation to which the elements of the PFET and the buried dielectric stressor elements are located. The directions of a compass: i.e., north, south, east and west provide a useful frame of reference for describing the PFET. These directions are indicated by the legend 101. These directions need not coincide with the true north, south, east and west directions, since the PFET 100 can operate in any orientation, at any angle towards the true north direction. Rather, the directions indicated by the legend 101 are useful in describing the placement and orientation of various elements of the PFET 100 in relation to each other.

The edges of the active semiconductor region 104 include a west edge 108, an east edge 110 which is opposite the west edge in the longitudinal (east-west) direction 112 of the PFET. The STI region 106 further defines a north edge 114 and a south edge 116 of the active semiconductor region 104 which is opposite from the north edge in a transverse direction 118 of the PFET. As further shown in FIG. 1A, a gate 120 including a gate conductor 121 and dielectric sidewalls or spacers 123 overlie the active semiconductor region between a source region 122 and a drain region 124. In the PFET shown in FIG. 1A, the first and second dielectric stressor elements 150, 152 apply compressive stresses to the active semiconductor region 104. Specifically, the first dielectric stressor element 150 underlies a northwest portion of the active semiconductor region 104 and the second dielectric stressor element 152 underlies a southeast portion of the active semiconductor region 104. The first and second dielectric stressor elements apply stresses to the channel region of the PFET in opposite directions, as indicated by the arrows 156 and 158. The results of these dielectric stressor elements is to apply oppositely directed forces to the channel region of the PFET at opposite (north and south) edges 114, 116 of the active semiconductor region and thus apply in-plane shear stress.

Figure 1B:
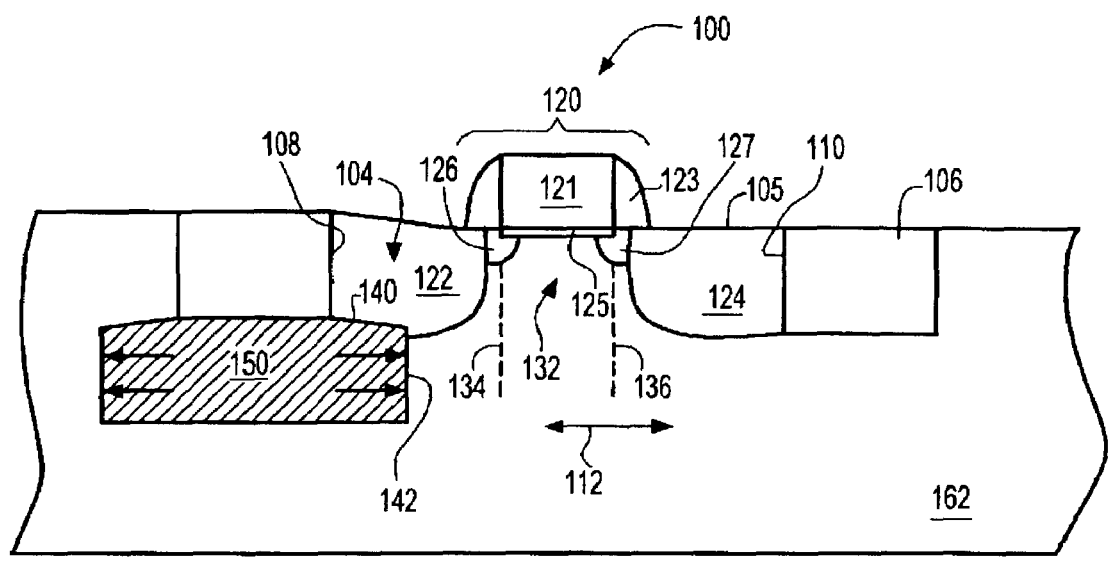
FIG. 1B is a sectional view along lines 1B—1B of the PFET shown in FIG. 1A.

FIG. 1B is a sectional view of PFET 100 through lines 1B—1B of FIG. 1A. As illustrated therein, the active semiconductor region 104 is provided in a bulk semiconductor substrate 162, preferably being a silicon substrate. A face 105 of the active semiconductor region 104 defines a major surface of the active semiconductor region. The gate 120, including a gate conductor 121 and spacers 123, overlies a channel region 132 of the PFET, as spaced therefrom by a gate dielectric 125. Edges of the channel region 132 are determined by the locations in the longitudinal direction of a first edge 134 of the gate conductor and a second gate edge 136 opposite thereto. The source region 122 including an optional extension and/or halo region 126 extends from the vicinity of the first gate edge 134 to the west edge 108 of the active semiconductor region at STI region 106. The drain region 124 including an optional extension and/or halo region 127 extends from the vicinity of a second edge 136 of the channel region to the east edge 110 of the active semiconductor region at STI region 106.

As further illustrated in FIG. 1B, the first buried dielectric stressor element 150 underlies a portion of the active semiconductor region including a portion of source region 122. The first buried dielectric stressor element 150 has a horizontally extending upper surface 140 (i.e., one extending in the longitudinal direction 112 and the transverse direction of the PFET). The first dielectric stressor element does not underlie the entirety of the active semiconductor region, but rather, the first dielectric stressor region shares an edge 142 with the active semiconductor region. The edge extends in a direction downward away from the generally horizontal upper surface 140, such direction having a vertical component. Preferably, the edge 142 of the dielectric stressor element is located at about one half the distance between the edge 108 of the active semiconductor region and the closest edge (first gate edge 134) of the gate conductor 121, as indicated by the dashed line.

Figure 1C:
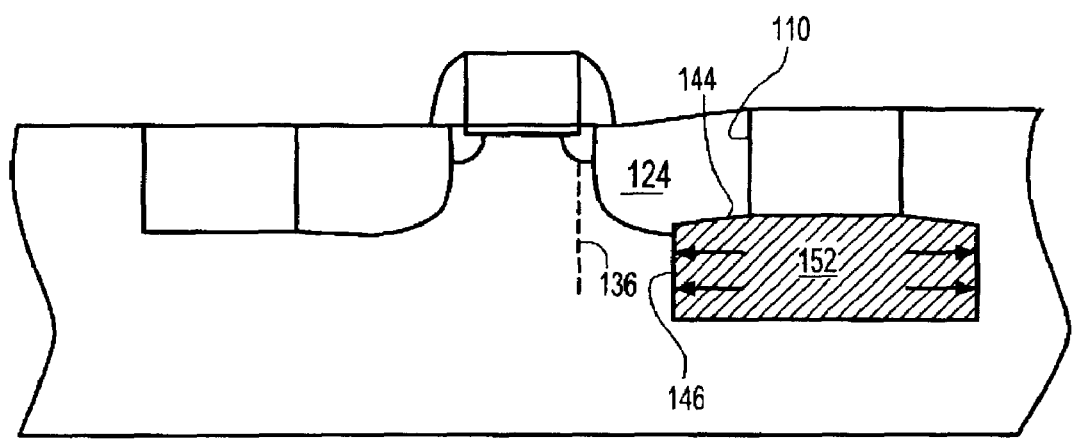
FIG. 1C is a sectional view along lines 1C—1C of the PFET shown in FIG. 1A.

FIG. 1C is a sectional view of the PFET 100 through lines 1C—1C of FIG. 1A. As shown in FIG. 1C, the second buried dielectric stressor element underlies a portion of the active semiconductor region including a portion of the drain region 124. The second buried dielectric stressor element 152 also has a horizontally extending upper surface 144. Similar to the first dielectric stressor region, the second dielectric stressor region shares an edge 146 with the active semiconductor region, the edge 146 extending generally in a downward direction away from the generally horizontal upper surface 144. Likewise, the edge of the second dielectric stressor element is disposed between the edge 110 of the active semiconductor region and the closest gate edge (second gate edge 136) thereto.

Figure 2:
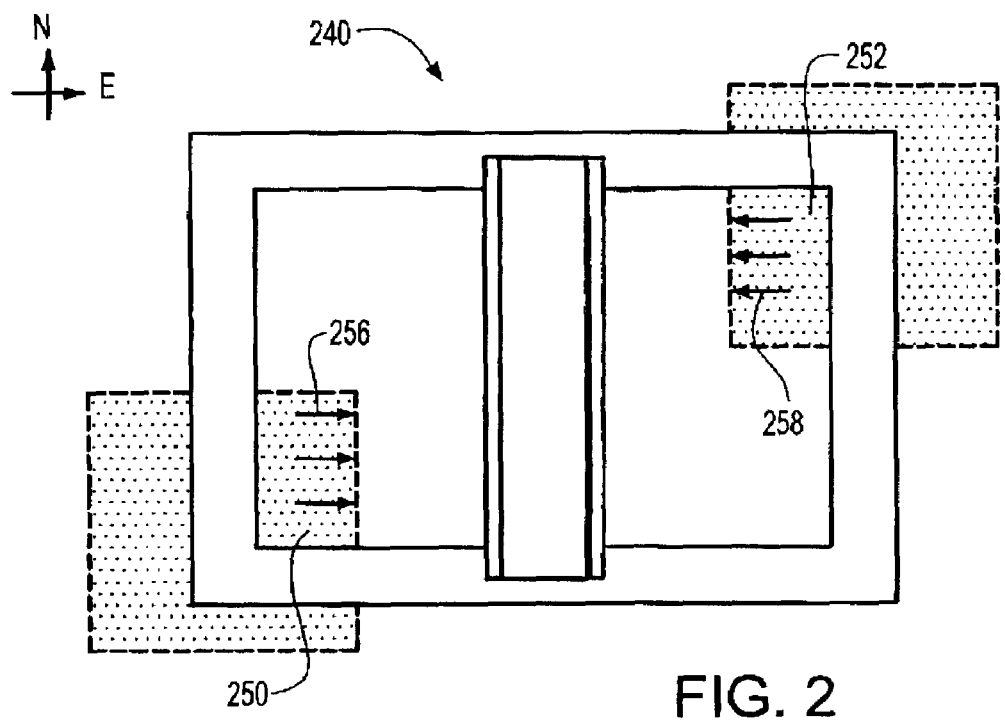
FIG. 2 is a face-up plan view of a PFET in accordance with another embodiment of the invention.

FIG. 2 is a face-up plan view of a PFET 240 according to a variation of the embodiment shown and described above with reference to FIGS. 1A–1C. With respect to PFET 240, all features of the transistor and the buried dielectric elements 250, 252 are the same as those of PFET 100 shown and described above (FIGS. 1A–1C), except that the dielectric stressor elements 250, 252 underlie the southwest and northeast portions of the active semiconductor region. Similar to the PFET 100, the dielectric stressor elements 250, 252 are compressively stressed. The dielectric stressor elements apply oppositely directed forces that apply shear stresses to the channel region, as shown by arrows 256, 258.

While in the above-described embodiments, compressively stressed dielectric elements are used with a PFET, and tensile-stressed dielectric elements are used with an NFET, this does not rule out the use of tensile-stressed dielectric elements with a PFET, nor rule out the use of compressive-stressed dielectric elements with an NFET. The beneficial effect of the shear stresses applied to the FET may overcome or at least mitigate the effect of somewhat compressive stress being applied to an NFET or somewhat tensile stress being applied to a PFET.

In addition, particularly in complementary metal oxide semiconductor ("CMOS") chips, it may be expedient to provide only one type of (tensile or compressive) stressed element in a particular chip. In such case, a net benefit derived from the in-plane shear stress applied to either the PFET or NFET may justify the less preferred compressive type of stress being applied to the NFET or the less preferred tensile type of stress being applied to the PFET.

Figure 3A:
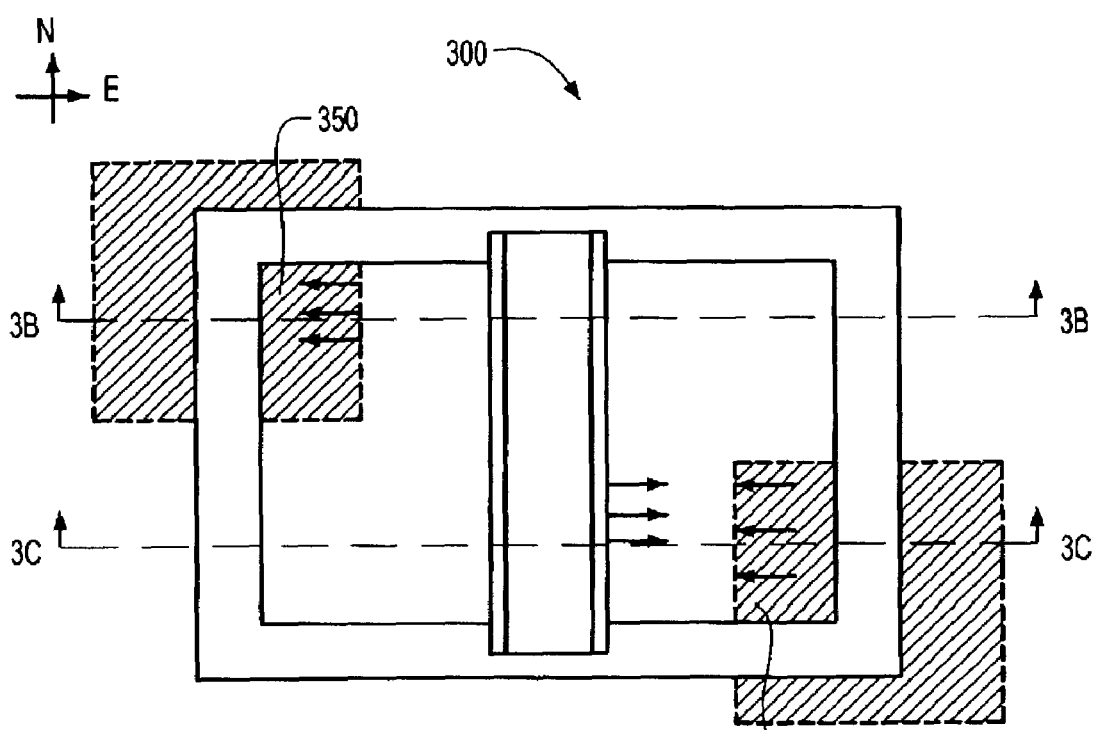
FIG. 3A is a face-up plan view of a NFET in accordance with another embodiment of the invention.
Figure 3B:
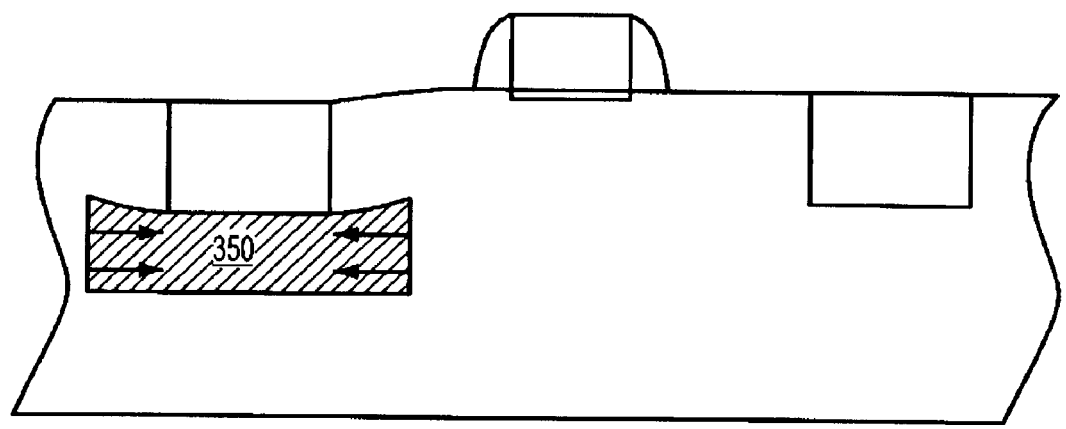
FIG. 3B is a sectional view along lines 3B—3B of the NFET shown in FIG. 3A.
Figure 3C:
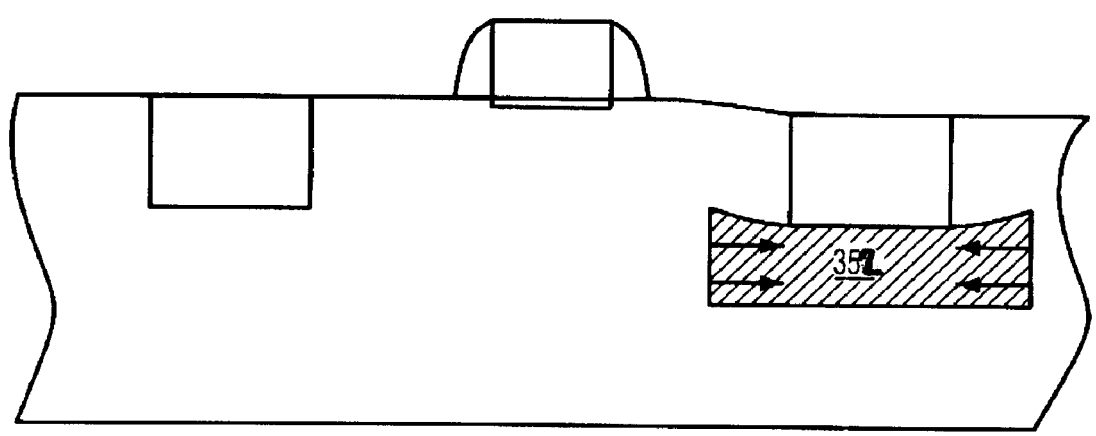
FIG. 3C is a sectional view along lines 3C—3C of the NFET shown in FIG. 3A.

FIG. 3A is a face-up plan view of an NFET 300 according to another embodiment of the invention. In this embodiment, like that of PFET 100 (FIGS. 1A–1C), buried dielectric stressor elements 350, 352 underlie northwest and southeast portions of the active semiconductor region, respectively. However, in contrast to that described above, the buried dielectric stressor elements 350, 352 exert tensile stresses upon the channel region of the NFET 300. This is best shown in the sectional views of FIGS. 3B and 3C. FIG. 3B is a sectional view through lines 3B—3B of FIG. 3A, and FIG. 3C is a sectional view through lines 3C—3C of FIG. 3A. As shown in FIG. 3B, the first buried dielectric stressor element 350 is a tensile stressed dielectric element. This stressor element is preferably in form of a region of "collapsed oxide," i.e., a region of oxide which has shrunken slightly from the volume formerly occupied by semiconductor material of the semiconductor substrate. Similarly, as shown in FIG. 3C, the second buried dielectric stressor element 352 is a tensile stressed dielectric element. This stressor element is also preferably in form of a region of "collapsed oxide." Except that the stress applied by the dielectric stressor elements is tensile and that the transistor is an NFET instead of a PFET, all other features shown in FIGS. 3B and 3C are the same as that shown and described above with respect to the PFET shown in FIGS. 1A–1C.

Figure 4A:
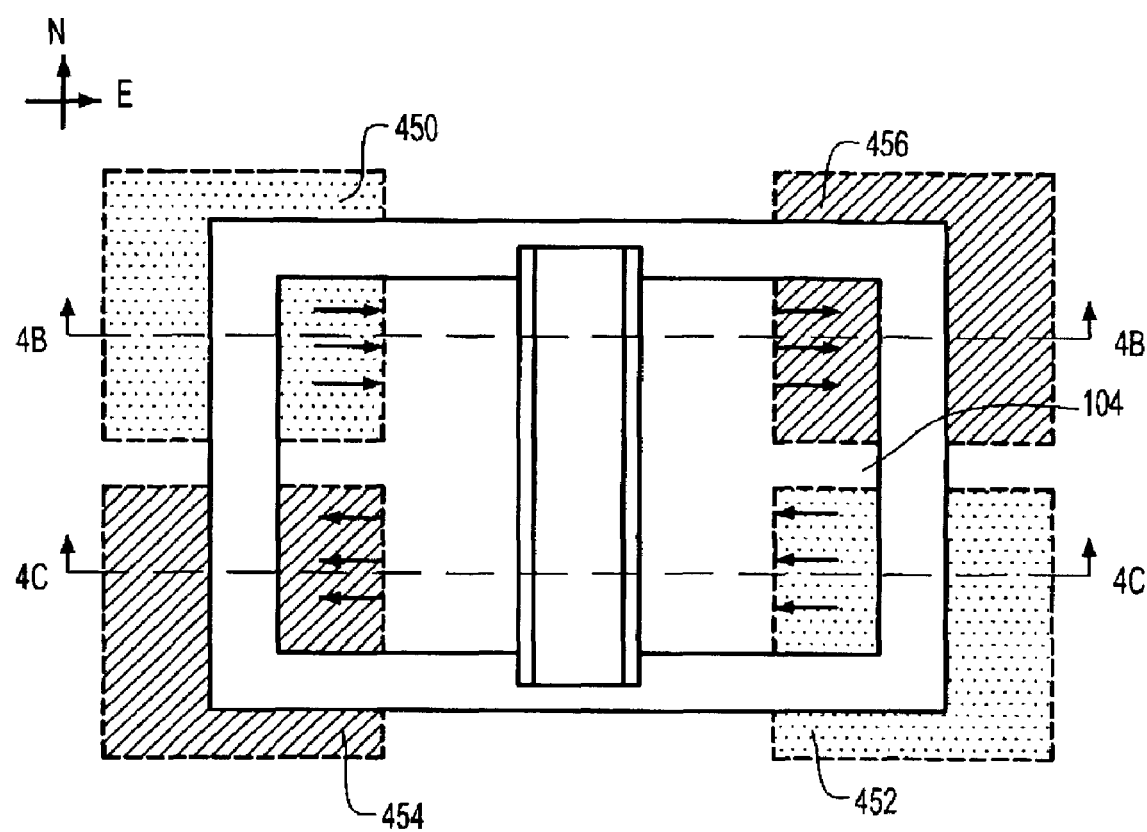
FIG. 4A is a face-up plan view of an FET in accordance with another embodiment of the invention.
Figure 4B:
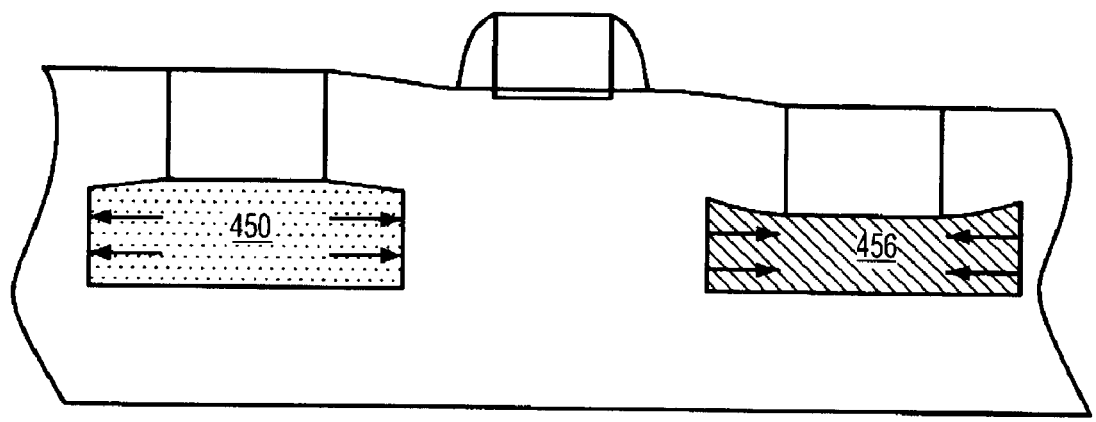
FIG. 4B is a sectional view along lines 4B—4B of the FET shown in FIG. 4A.
Figure 4C:
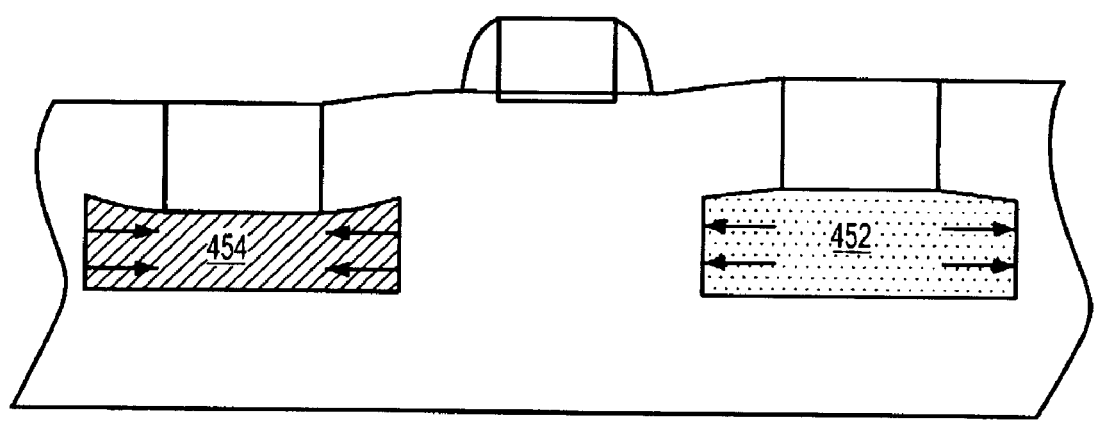
FIG. 4C is a sectional view along lines 4C—4C of the FET shown in FIG. 4A.

A further embodiment of the invention is illustrated in the face-up plan view of FIG. 4A and in the sectional views of FIGS. 4B and 4C, which are views through line 4B—4B and through line 4C—4C, respectively. In this embodiment, the dielectric stressor elements include elements 450, 452 underlying northwest and southeast portions of the active semiconductor region which are compressively stressed. In addition, other dielectric stressor elements 454, 456 underlying the southwest and northeast portions of the active semiconductor region are tensile stressed. Together, the compressively stressed elements and the tensile stressed elements exert shear stresses upon the channel region of an FET which is provided in an active semiconductor region of a substrate. The FET can be a PFET or an NFET. Otherwise, all other features of the FET shown in FIGS. 4A through 4C are the same as that shown and described above with respect to the PFET shown in FIGS. 1A–1C.

Figure 5:
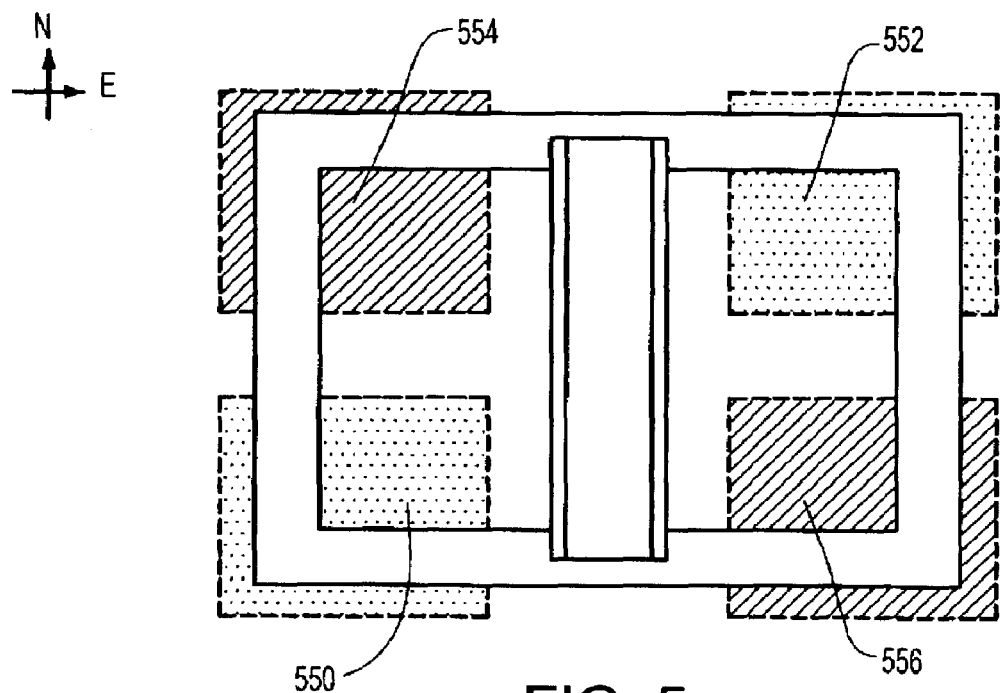
FIG. 5 is a face-up plan view of an FET according to a variation of the embodiment shown in FIGS. 4A–4C.

FIG. 5 illustrates a further variation in which the orientation of the compressively stressed dielectric elements 550 and 552 is different from that shown in FIGS. 4A through 4C. Here, the compressively stressed dielectric elements 550 and 552 underlie southwest and northeast portions, respectively, of the active semiconductor region. On the other hand, tensile stressed dielectric elements 554, 556 underlie the northwest and southeast portions of the active semiconductor region, respectively.

Figure 6:
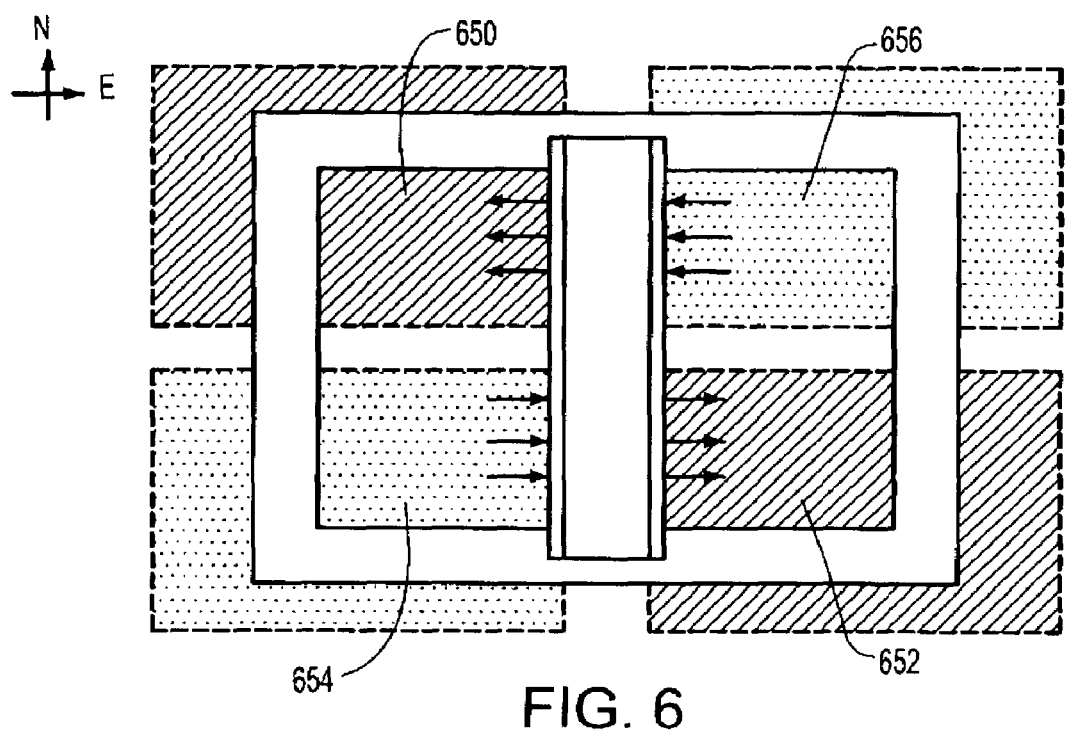
FIG. 6 is a face-up plan view of an FET according to another variation of the embodiment shown in FIGS. 4A–4C.

FIG. 6 is a face-up plan view illustrating a variation of the embodiment described above with respect to FIGS. 4A through 4C. As shown therein, the dielectric stressor elements 650, 652, 654 and 656 extend farther underneath the active semiconductor region so that the edges of the dielectric stressor elements extend to a first gate edge or to a second gate edge of the FET, respectively, which may be either a PFET or an NFET. As such, the closer proximity of the edges of the dielectric stressor elements to the channel region can help to impart higher levels of shear stress to the channel region of the FET.

Referring now to FIG. 7 through FIG. 10, a method of manufacturing the FET 100 (FIGS. 1A, 1B and 1C) will now be described. Such method utilizes a process similar to that described in commonly assigned U.S. Patent Publication No. 2005/0067294 to Choe et al. In Choe et al., a region of a silicon substrate is implanted and treated to form a buried oxide layer of a silicon-on-insulator ("SOI") substrate. A porous silicon region is formed by ion implantation of a p-type dopant (for example, Ga, Al, B and $BF_2$) and subsequent anodization. The porous silicon region is then oxidized to form the buried oxide layer.

Figure 7:
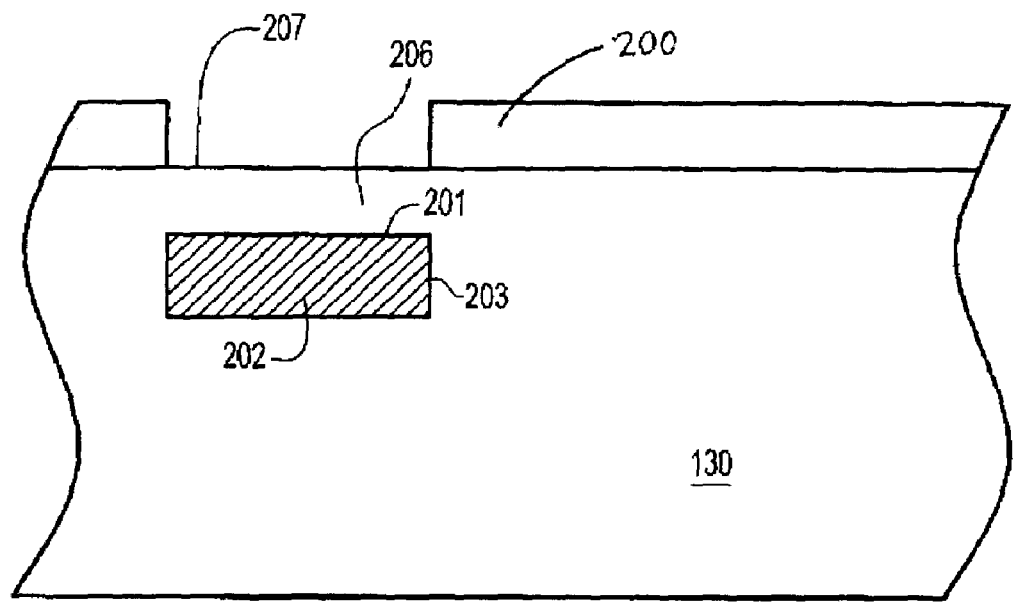
FIGS. 7 through 10 are sectional views along line 1B—1B of FIG. 1A illustrating steps in a method of fabricating a FET in accordance with an embodiment of the invention.

In the present process, dielectric stressor elements are formed at locations of a semiconductor substrate, e.g., a silicon substrate, which underlie only portions (not all) of an active semiconductor region. As shown in FIG. 7, a masking layer 200, e.g., a photoresist is patterned, and a buried region 202 underlying a major surface 207 of the substrate 130 is implanted with a p-type dopant. With reference to the face-up plan view of FIG. 1A, the following description pertains to the simultaneous implanting and processing of two such regions. Other views (not shown) along line 1C—1C of FIG. 1A would illustrate the same process steps carried out simultaneously to form and process a second region into a second buried dielectric stressor element 152 (FIG. 1A). As implanted, the dopant concentration in region 202 can range from about $1 \times 10^{19}$ cm$^{-3}$ to about $5 \times 10^{20}$ cm$^{-3}$ or higher. In any case, the achieved boron concentration must be significantly higher, i.e., one or more orders of magnitude higher than a normal (p-) p-type dopant concentration in the single-crystal silicon. Preferably, the dopant consists essentially of boron (B) or boron fluoride ($BF_2$), but gallium (Ga) and aluminum (Al) can be used instead. The depth to which ions are implanted into the semiconductor substrate determines the thickness of the dielectric stressor element. The depth of the implant, in turn, is selected in accordance with the energy at which the implant is conducted. As this implant is performed through a photolithographically patterned masking layer, the process of implanting the region 202 defines the edge 203 of the implanted region, such edge 203 extending in a direction away from the horizontal upper surface 201 of the implanted region.

Thereafter, the masking layer 200, e.g., a photoresist layer is stripped and the semiconductor substrate undergoes an anodization process to convert the pocket p-doped regions into buried porous semiconductor regions. The pocket regions become porous semiconductor regions as a result of the anodization process.

The anodization process is as follows. The semiconductor substrate 130, which preferably consists essentially of silicon and which has buried p-type implanted pocket regions is placed or preferably submerged in a bath containing a solution of hydrogen fluoride (HF), as well as a platinum electrode. The semiconductor substrate 130 is connected to a positive terminal of a current source, and the platinum electrode is connected to the negative terminal of that current source is connected in conductive communication with the current source that is connected to the positive terminal. The current source supplies an anodization current to the semiconductor substrate and the HF solution which controls the anodization process. In the presence of the anodization current, the HF solution readily diffuses through the single crystal semiconductor (silicon) to the higher concentration p-type doped pocket regions.

Figure 8:
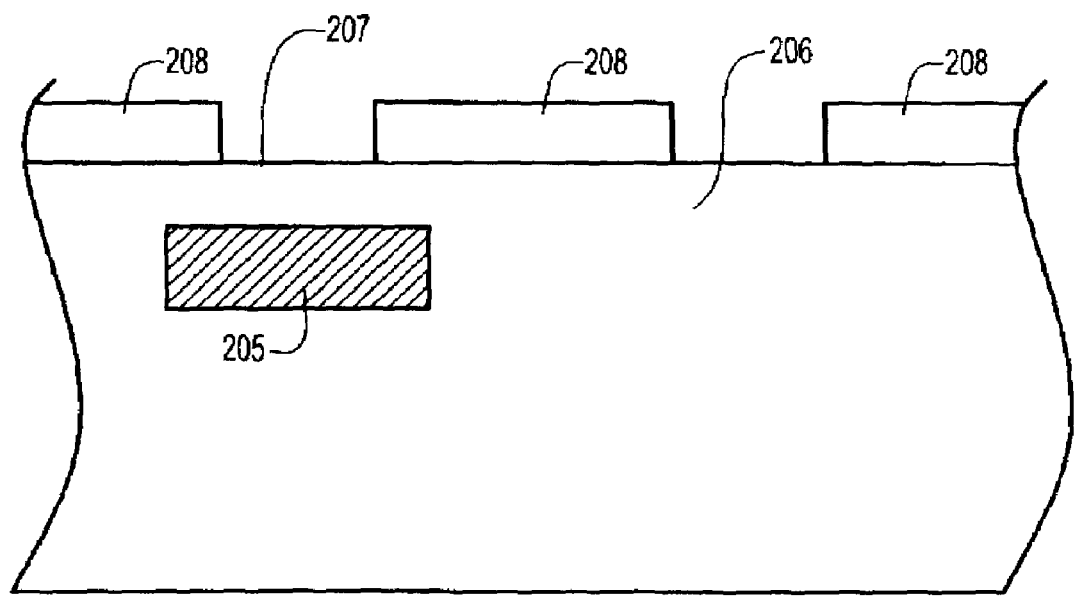

In those higher concentration pocket regions, the HF solution reacts with the highly doped p-type silicon to form a porous silicon pocket region 205 as shown in FIG. 8. Again, one or more additional porous silicon pocket regions are preferably formed simultaneously with pocket region 205, those silicon pocket regions not being visible in FIG. 8. This step is performed prior to forming an additional masking layer 208 as will be described below. The anodization current is in the range of 1 mA/cm$^2$ to 100 mA/cm$^2$, depending on the degree of porosity or density of the porous silicon region 205 which are to result from this process. Both the concentration of boron or other p-type dopant in the silicon and the magnitude of the anodization current can be used to control the degree of porosity. That is, these parameters control the density of the buried pocket region, as measured by the mass of silicon the remains within the buried pocket region divided by its volume. For example, a low porosity region, that is, a region having a relatively high density, is one which has a density of greater than about 44% of the density of the original silicon substrate. On the other hand, a high porosity region, that is, a region having a relatively low density, is one which has a density of less than about 44% of the density of the original silicon substrate.

After anodization, the substrate is then subjected to a hydrogen bake, which removes most of the implanted boron remaining in the silicon. It is necessary to eliminate high concentrations of boron from the silicon substrate at this stage in order to avoid such high concentrations from interfering with processes used to subsequently define the differently doped regions of a transistor, i.e., the channel region, the source and drain regions, halo and/or extension regions. The hydrogen bake is conducted at temperatures ranging from about 800 degrees centigrade ("C") to 1,000 degrees C, for periods ranging from about 30 seconds to 30 minutes.

After the anodization and post-bake processes, regions of porous silicon remain in locations which are at least generally coextensive with the pocket regions, of which only one such porous silicon region 205 is visible in the sectional view of FIG. 8. The porous silicon regions are regions which contain a multiplicity of voids. As viewed with an electron microscope, the porous silicon regions have an appearance similar to a sponge or foam material, having large numbers of voids which are supported together by connecting structure of the remaining silicon material. The degree of porosity in the porous silicon regions is determined at least in part by the initial concentration of boron within the buried pocket regions. As described above, by appropriately selecting the dose of boron that is implanted into the pocket regions and/or by controlling the amount of anodization current, it is possible to remove little mass or much greater mass of the silicon material from the buried pocket regions.

Figure 9:
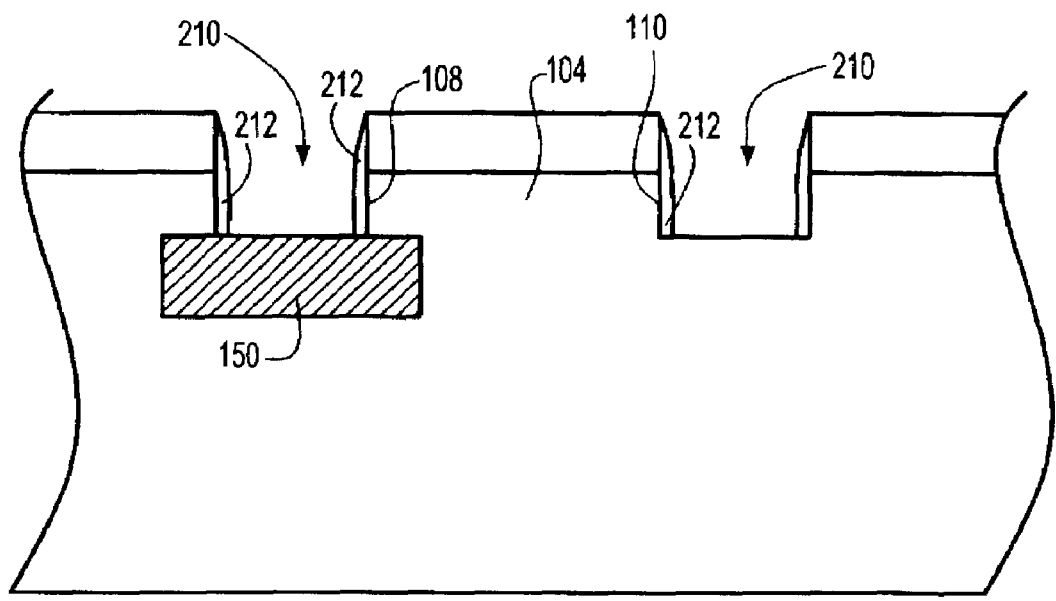

Next, as illustrated in FIG. 8, another masking layer 208, e.g., a photoresist is deposited and patterned over the major surface 207 of the substrate. As shown in FIG. 9, the substrate is then patterned with this masking layer to form trenches 210 in the upper silicon layer 206 above the buried porous regions to define edges 108, 110 of the active semiconductor region 104. The trenches 210 are etched in locations which expose the porous silicon regions. Then, after appropriately protecting the edges of the active semiconductor region, as by forming spacers 212 of silicon nitride thereon, the exposed porous silicon regions are subjected to an oxidation process which forms the dielectric stressor elements 150, 152 described above with reference to FIG. 1A.

Figure 10:
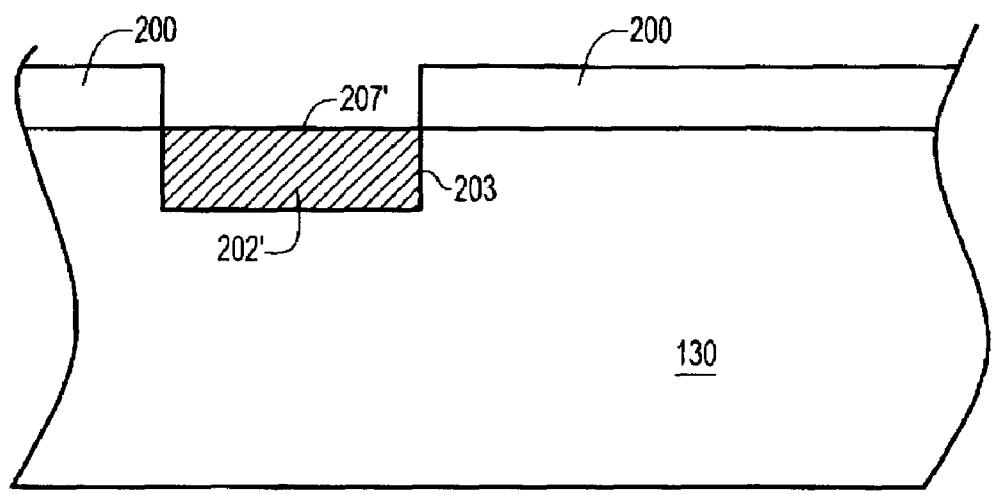

FIG. 10 illustrates a variation of the above-described embodiment in which the p-type dopant implants used to define the buried porous silicon regions are performed into regions at the exposed surface of the substrate rather than directly into buried subsurface regions as described above relative to FIG. 7. Specifically, as shown in FIG. 10, the initial implant is performed simultaneously into a region 202' corresponding to the dielectric stressor element 150 (FIG. 1A) and another region corresponding to dielectric stressor element 152 (FIG. 1A), which is not visible in the view shown in FIG. 10. These regions extend downward from an initial exposed major surface 207' of the substrate 130. After such implant, the photoresist is stripped and the substrate is annealed to heal damage to the single-crystal silicon material from the implanting process. An epitaxial layer of silicon is then grown over exposed surfaces of the semiconductor substrate including the implanted regions to form a structure which appears in essential respects to be similar to the structure shown in FIG. 7. The epitaxial layer includes an active semiconductor region 206 in which a field effect transistor ("FET") will be formed later. As a result of growing the epitaxial semiconductor layer to form the structure as shown in FIG. 7, the implanted regions become buried implanted regions, also referred to as "pocket regions," each of these pocket regions having an upper surface 201 extending in a horizontal direction underlying the active semiconductor region 206. Specifically, the pocket regions extend in a horizontal direction parallel to the horizontal major surface 207 of the active semiconductor region 206. Each pocket region shares an edge 203 with the active semiconductor region 206, the edges 203 extending in a direction away from the horizontal direction in which the upper surface 201 extends. Thereafter, processing continues with the anodization of the implanted regions 202 to form a buried porous silicon region 205 and subsequent processing in the manner described above with respect to FIGS. 8 and 9.

Depending on the degree of porosity within the porous regions, the dielectric stressor elements apply a compressive stress or a tensile stress to adjacent portions of the semiconductor substrate. This result is explained as follows. The volume of silicon dioxide is greater than silicon by a ratio of 2.25:1. Thus, when the proportion of silicon that remains within each porous silicon region is greater than 1/2.25 (i.e., the remaining silicon mass within the volume of the porous silicon region is greater than about 44% of the original mass), the resulting silicon dioxide expands, causing the dielectric regions to become compressively stressed when the porous regions are oxidized. Stated another way, the resulting silicon dioxide expands to become compressively stressed when the porosity is less than 56%, that is, when the amount of mass removed from the defined volume of the porous silicon region is less than 56% of the original mass.

Conversely, when the porosity is greater than 56%, the resulting silicon dioxide contracts, causing the resulting dielectric regions to become tensile stressed. As mentioned above, the degree of porosity is at least partly determined by the conditions under which the regions are implanted with boron and the conditions of the etching process. In general, the degree of porosity is higher when the implanted boron concentration is higher, and the degree of porosity of lower when the implanted boron concentration is lower. Also, in general, higher porosity can be achieved when the current density of the etching process is higher. Conversely, lower porosity is achieved when the current density is lower.

In the processes described in the foregoing, the edges of the implanted regions are defined lithographically. Accordingly, it follows that the extent of the porous silicon regions are determined at least in part by such lithographic processing. Hence, locations of the edges of the dielectric stressor regions that result from oxidizing the porous silicon regions are determined at least in part by the lithographic processing used to mask the substrate when implanting the dopant to form the implanted regions.

After forming the dielectric stressor elements in the above manner, the trenches 210 (FIG. 10) are filled with a dielectric material such as an oxide of silicon (e.g., silicon dioxide) to form one or more trench isolation ("IT") regions or shallow trench isolation regions ("STI") regions 106, as shown in FIG. 1A. The dielectric fill is deposited via a high density plasma ("HDP") technique and/or other chemical vapor deposition ("CVD") technique including low pressure CVD ("LPCVD"), plasma enhanced CVD ("PECVD"), etc., which may involve deposition form a tetraethylorthosilicate ("TEOS") precursor, for example. The dielectric material can include a nitride, e.g., silicon nitride which lines interior walls of the trenches, prior to deposition of the dielectric fill.

After forming the buried dielectric stressor elements, the gate conductor 121, dielectric spacers 123, and source and drain regions 122, 124, including extension regions and/or halo regions 126, 127 are formed, as shown in FIGS. 1A–1B. This completes the formation of PFET 100, having the dielectric stressor elements 150, 152 as shown in the sectional view in FIG. 1A.

Figure 11:
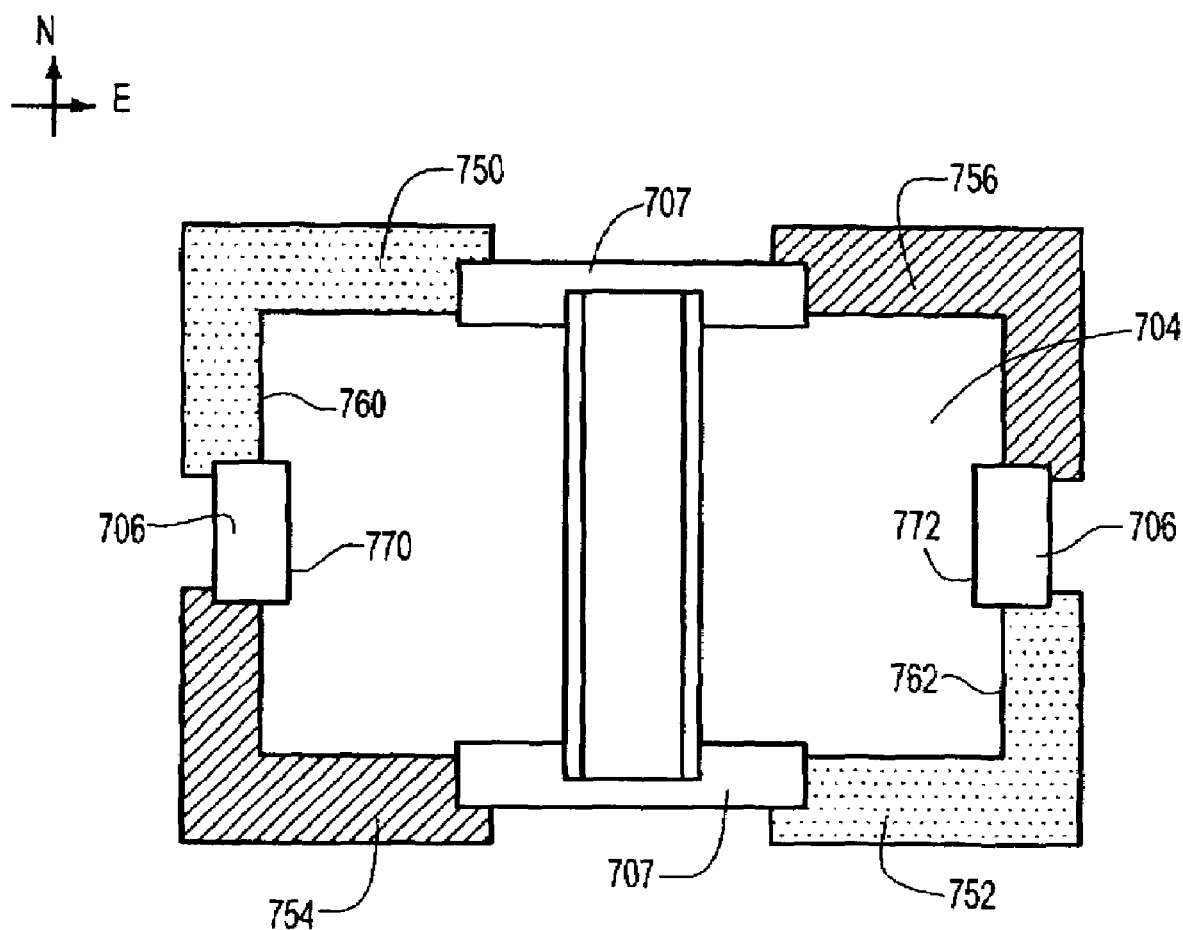
FIG. 11 is a face-up plan view of an FET according to another variation of the embodiment shown in FIGS. 4A–4C.

FIG. 11 illustrates a further variation of the embodiment shown and described above with respect to FIGS. 4A through 4C. As in the above-described embodiments, the dielectric stressor elements apply forces in opposite directions to the channel region of the transistor to apply in-plane shear stresses thereto. In this embodiment, compressive dielectric stressor elements 750, 752 are disposed at the northwest and southeast corners of the active semiconductor region, and tensile dielectric stressor elements 754, 756 are disposed at the southwest and northeast corners. However, in this embodiment, the dielectric stressor elements are not buried beneath the active semiconductor region 104 as they are in the above-described embodiments. Instead, the dielectric stressor elements are located in regions which are exposed at the top (major) surface of the active semiconductor region. As such, the dielectric stressor elements in this case have exposed surfaces which are at least substantially in the same plane with the major surface of the active semiconductor region and the exposed surfaces of isolation regions, e.g., shallow trench isolation ("STI") regions 706 which are disposed at the east and west edges of the active semiconductor region 704 and STI regions 707 which are disposed at the north and south edges of the active semiconductor region 704.

The dielectric stressor elements are preferably fabricated according to the process embodiment described above with reference to FIGS. 7 through 9, except that the implant is performed into the semiconductor region extending from the major surface (rather than into a buried region underlying the active semiconductor region). However, with respect to the processing performed in relation to FIG. 9, the trenches in which the STI regions 706, 707 are formed are only partially cut into the edges of the dielectric stressor elements, as shown in FIG. 11.

Here, due to overlay tolerances in separate processing performed to define the dielectric stressor elements and the STI regions, edges of the dielectric stressor elements may be shifted somewhat relative to edges of the STI regions. In this case, an embodiment is illustrated in which the inner edges of the dielectric stressor elements, e.g., edges 760, 762 for example, are disposed at greater distance from the gate conductor than the inner edges 770, 772 of the STI regions 706, respectively. Of course, other alternatives exist, such as to bias tolerances in a way that tends to locate the inner edges of the dielectric stressor elements closer to the gate conductor than the edges of the STI regions. In another variation, the dielectric stressor elements may be arranged to have the same or nearly identical linewidth as the STI regions, but due to the mask overlay tolerance, some north-south or east-west shifting or rotation of the STI may occur in relation to the dielectric stressor elements.

In a variation of this embodiment, different processing is used to form the dielectric stressor elements. In such variation, instead of the above-described processes of implanting, anodization and oxidation to form the stressor elements, different types of dielectric fill materials can be used to form the stressor elements having either tensile or compressive stress. It is known from the above-referenced patent publication no. US 2004/0113174, for example, to form compressive stressor elements using a high density plasma oxide fill and to form tensile stressor elements using a tetraethylorthosilicate (TEOS) oxide fill. However, such patent publication does not specifically describe stressor elements which exert stresses in opposite directions to apply a magnified in-plane shear stress to the channel region of a transistor. In this case, the compressive stressor elements 750, 752 can be formed by processes which use an HDP oxide to fill etched trenches. On the other hand, the tensile stressor elements 754, 756 can be formed by processes which use a tensile oxide, e.g., one deposited from a TEOS precursor to fill etched trenches.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A chip, comprising:
an active semiconductor region having a west edge, an east edge, a north edge and a south edge, said active semiconductor region having a longitudinal direction in a direction between said west and east edges and a transverse direction in a direction between said north and south edges,
a field effect transistor ("FET") having a channel region, a source region and a drain region all disposed within said active semiconductor region, a length of said channel region being disposed in said longitudinal direction, and a width of said channel region being disposed in said transverse direction;
a first dielectric stressor element underlying only a northwest portion of said active semiconductor region between said north and west edges, said first dielectric stressor element having a horizontally extending upper surface, said first dielectric stressor element sharing an edge with said active semiconductor region, said edge extending in a direction away from said upper surface; and
a second dielectric stressor element underlying only a southeast portion of said active semiconductor region between said south and east edges, said second dielectric stressor element having a horizontally extending upper surface, said second dielectric stressor element sharing an edge with said active semiconductor region, said edge extending in a direction away from said upper surface, wherein said first dielectric stressor element applies a first stress to the channel region in a first direction and said second dielectric stressor element applies a second stress to the channel region in a second direction opposite to said first direction, such that said first and second stresses cooperate together to apply a magnified shear stress to said channel region.

2. The chip as claimed in claim 1, wherein said first dielectric stressor element exerts a compressive stress in said first direction, and said second dielectric stressor element exerts a compressive stress in said second direction.

3. The chip as claimed in claim 1, wherein said first dielectric stressor element exerts a tensile stress in said first direction, and said second dielectric stressor element exerts a tensile stress in said second direction.

4. The chip as claimed in claim 2, further comprising:
a third dielectric stressor element underlying only a southwest portion of said active semiconductor region between said south and west edges, said third dielectric stressor element having a horizontally extending upper surface, said third dielectric stressor element sharing an edge with said active semiconductor region, said edge extending in a direction away from said upper surface; and
a fourth dielectric stressor element underlying only a northeast portion of said active semiconductor region between said north and east edges, said fourth dielectric stressor element having a horizontally extending upper surface, said fourth dielectric stressor element sharing an edge with said active semiconductor region, said edge extending in a direction away from said upper surface, said third dielectric stressor element applying a shear stress to said channel region in one of said first and second directions and said fourth dielectric stressor element applying a shear stress to said channel region in another of said first and second directions opposite to said one of said first and second directions.

5. The chip as claimed in claim 4, wherein said third dielectric stressor element exerts a tensile stress in said one of said first and second directions, and said fourth dielectric stressor element exerts a tensile stress in said another of said first and second directions.

6. The chip as claimed in claim 3, further comprising:
a third dielectric stressor element underlying only a southwest portion of said active semiconductor region between said south and west edges, said third dielectric stressor element having a horizontally extending upper surface, said third dielectric stressor element sharing an edge with said active semiconductor region, said edge extending in a direction away from said upper surface; and a fourth dielectric stressor element underlying only a northeast portion of said active semiconductor region between said north and east edges, said fourth dielectric stressor element having a horizontally extending upper surface, said fourth dielectric stressor element sharing an edge with said active semiconductor region, said edge extending in a direction away from said upper surface, said third dielectric stressor element applying a shear stress to said channel region in one of said first and second directions and said fourth dielectric stressor element applying a shear stress to said channel region in another one of said first and second directions opposite to said one direction.

7. The chip as claimed in claim 6, wherein said third dielectric stressor element exerts a compressive stress in said one of said first and second directions and said fourth dielectric stressor element exerts a compressive stress in said another of said first and second directions.

8. The chip as claimed in claim 1, wherein first dielectric stressor element contacts a trench isolation region, said trench isolation region sharing at least one of said north edge, said east edge, said south edge and said west edge with said active semiconductor region.

9. The chip as claimed in claim 1, wherein said edges of said first and second dielectric stressor elements extend in an at least generally vertical direction away from said upper surfaces of said first and second dielectric stressor elements.

10. The chip as claimed in claim 1, wherein said FET further includes a gate conductor having a conductive portion overlying said channel region, said conductive portion having a vertically oriented first gate edge and a vertically oriented second gate edge opposite said first gate edge, wherein said edge of said first dielectric stressor element is aligned with said first gate edge and said edge of said second dielectric stressor element is aligned with said second gate edge.

11. The chip as claimed in claim 8, wherein each of said north, east, south and west edges of said active semiconductor region are shared with said trench isolation region, said first dielectric stressor element contacts substantially less than entire lengths of said north edge and said west edge and said second dielectric stressor element contacts substantially less than entire lengths of said south edge and said east edge.

12. A chip, comprising:
an active semiconductor region having a west edge, an east edge, a north edge and a south edge, said active semiconductor region having a longitudinal direction in a direction between said west and east edges and a transverse direction in a direction between said north and south edges, a field effect transistor ("FET") having a channel region, a source region and a drain region all disposed within said active semiconductor region, a length of said channel region being disposed in said longitudinal direction, and a width of said channel region being disposed in said transverse direction;

a first dielectric stressor element underlying only a southwest portion of said active semiconductor region between said south and west edges, said first dielectric stressor element having a horizontally extending upper surface, said first dielectric stressor element sharing an edge with said active semiconductor region, said edge extending in a direction away from said upper surface; and a second dielectric stressor element underlying only a northeast portion of said active semiconductor region between said north and east edges, said second dielectric stressor element having a horizontally extending upper surface, said second dielectric stressor element sharing an edge with said active semiconductor region, said edge extending in a direction away from said upper surface, wherein said first dielectric stressor element applies a first stress to the channel region in a first direction and said second dielectric stressor element applies a second stress to the channel region in a second direction opposite to said first direction, such that said first and second stresses cooperate together to apply a magnified shear stress to said channel region.

13. The chip as claimed in claim 12, wherein said first dielectric stressor element exerts a compressive stress in said first direction, and said second dielectric stressor element exerts a compressive stress in said second direction.

14. The chip as claimed in claim 12, said first dielectric stressor element exerts a tensile stress in said first direction, and said second dielectric stressor element exerts a tensile stress in said second direction.

15. A method of fabricating a field effect transistor ("FET") device, comprising:
within a semiconductor substrate, forming a first buried porous semiconductor region and a second buried porous semiconductor region, the first and second buried porous semiconductor regions being disposed below an overlying semiconductor portion of the substrate, the first and second buried porous semiconductor regions having a multiplicity of voids and a density substantially lower than a density of the overlying semiconductor portion;

oxidizing the first and second buried porous semiconductor regions to form a first dielectric stressor element and a second dielectric stressor element;

forming a field effect transistor ("FET") having a channel region, a source region and a drain region all extending within the overlying semiconductor portion of the substrate, the FET partially overlying the first dielectric stressor element and partially overlying the second dielectric stressor element, wherein the first dielectric stressor element applies a first stress to the channel region in a first direction and the second dielectric stressor element applies a second stress to the channel region in a second direction opposite to the first direction, such that the first and second stresses cooperate together to apply a magnified shear stress to the channel region.

16. The method of fabricating the FET as claimed in claim 15, wherein the step of forming the first and second buried porous semiconductor regions includes implanting a dopant into first and second regions of the substrate through first and second openings in a mask, respectively, and exposing the substrate to an anodization process.

17. The method of fabricating the FET as claimed in claim 16, wherein the step of forming the first and second buried porous semiconductor regions further includes a pre-bake process to reduce a concentration of the dopant within the first and second buried porous semiconductor regions.

18. The method of fabricating the FET as claimed in claim 16, wherein the step of implanting the dopant is performed to implant the dopant into the first and second regions while the first and second regions are exposed at a major surface of the substrate, the method further comprising growing an epitaxial layer to form the overlying semiconductor portion prior to exposing the substrate to the anodization process.

19. The method of fabricating the FET as claimed in claim 15, wherein, when the step of implanting is performed, the first and second regions are disposed below the overlying semiconductor portion.

20. The method of fabricating the FET as claimed in claim 16, wherein edges of the first and second dielectric stressor elements are determined photolithographically during the step of implanting.

* * * * *